United States Patent
Yamada et al.

(10) Patent No.: US 8,238,064 B2
(45) Date of Patent: Aug. 7, 2012

(54) MAGNETIC HEAD AND MAGNETIC RECORDING APPARATUS

(75) Inventors: Masaki Yamada, Miyagi (JP); Hiromasa Takahashi, Tokyo (JP)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 610 days.

(21) Appl. No.: 12/315,525

(22) Filed: Dec. 3, 2008

(65) Prior Publication Data
US 2009/0154030 A1    Jun. 18, 2009

(30) Foreign Application Priority Data
Dec. 14, 2007 (JP) ................................. 2007-323468

(51) Int. Cl.
*G11B 5/10* (2006.01)
*G11B 5/33* (2006.01)
(52) U.S. Cl. .................. 360/324.2; 360/322; 360/319
(58) Field of Classification Search .............. 360/324.2, 360/322, 324.11, 319, 59, 593; 365/158, 365/213; 257/421
See application file for complete search history.

(56) References Cited

U.S. PATENT DOCUMENTS

| | | | |
|---|---|---|---|
| 7,209,328 B2 | 4/2007 | Ito et al. | |
| 2004/0264064 A1* | 12/2004 | Sakakima | 365/158 |
| 2005/0088787 A1* | 4/2005 | Takahashi et al. | 360/324.2 |
| 2005/0116308 A1* | 6/2005 | Bangert | 257/421 |
| 2005/0180239 A1* | 8/2005 | Tsang | 365/213 |
| 2006/0022220 A1 | 2/2006 | Inomata et al. | |
| 2007/0230067 A1* | 10/2007 | Jogo et al. | 360/324.1 |
| 2007/0253121 A1* | 11/2007 | Yamada et al. | 360/324.11 |
| 2008/0247072 A1* | 10/2008 | Nozieres et al. | 360/59 |

OTHER PUBLICATIONS

Jedema et al., "Spin Injection and Spin Accumulation in All-Metal Mesoscopic Spin Valves", Physical Review B, vol. 67, 085319 (2003).
Takahashi at al., "Spin Injection and Detection in Magnetic Nanostructures", Physical Review B, vol. 67, 052409 (2003).
Kimura et al., "Room-Temperature Reversible Spin Hall Effect", Physical Review Letters, vol. 98, 156601 (2007).

* cited by examiner

*Primary Examiner* — Kevin M. Bernatz
*Assistant Examiner* — Louis Falasco
(74) *Attorney, Agent, or Firm* — Patterson & Sheridan, LLP

(57) ABSTRACT

Embodiments of the present invention provide an accumulation element with high resolving power and high output suitable for magnetic recording and reproducing at high recording density. According to one embodiment, a plurality of spin injection parts and are provided to increase the total amount of spin electrons. The spin accumulation element is composed of a non-magnetic conductor, a first magnetic conductor, a second magnetic conductor, and a third magnetic conductor, each of which are in contact with the non-magnetic conductor through the tunneling junction. An output voltage due to the spin accumulation effect is detected as a potential difference between the non-magnetic conductor and the third magnetic conductor. The first magnetic conductor of the first spin injection part is fixed by a first antiferromagnetic conductor and the second magnetic conductor of the second spin injection part is fixed by a second antiferromagnetic conductor so that their directions of magnetization are anti-parallel to each other.

20 Claims, 11 Drawing Sheets

(a)

(b)

(c)

(d)

MAGNETIC HEAD AND MAGNETIC RECORDING APPARATUS

CROSS-REFERENCE TO RELATED APPLICATION

The instant nonprovisional patent application claims priority to Japanese Patent Application No. 2007-323468 filed Dec. 14, 2007 and which is incorporated by reference in its entirety herein for all purposes.

BACKGROUND OF THE INVENTION

The recording density of a magnetic recording/reproducing apparatus has been increasing at an annual rate from 40 to 60%, and is estimated to reach Tbit/in$^2$ in the near future. Accordingly, it is required that a magnetic recording/reproducing head has higher output and higher resolving power. Presently, the magnetic reproducing heads such as a CPP-GMR (Current Perpendicular to Plane Giant Magneto Resistance) head in which a sense current is passed perpendicularly to the laminated plane, and a TMR (Tunneling Magneto Resistance) head, have been proposed. However, for these heads, it may be difficult to make the gap length $G_w$ between shields 30 nm or less due to the requirements for the film thickness of an element, and difficult to apply them to the medium of 1 Tbit/in$^2$ or more in respect of the resolving power. For example, the gap length of the reproducing head for the medium of 1 Tbit/in$^2$ is $G_w$=25 nm, which can not be treated by the prior art such as the CPP-GMR or TMR.

Therefore, a high resolving power reproducing head using a spin accumulation effect has been proposed in "Spin Injection and Spin Accumulation in all-metal Mesoscopic Spin Valves", F. J. Jedema et al., Physical Review B, vol. 67, (2003), p. 85319 ("non-patent document 1"), and Japanese Patent Publication No. 2004-342241 ("patent document 1"). The spin accumulation effect is a phenomenon in which when a current is passed from a ferromagnetic substance to a non-magnetic metal, spin polarized electrons are accumulated in the non-magnetic metal in the range of spin diffusion length $\lambda$. The spin diffusion length $\lambda$ represents the distance where information of spin disappears (spin is reversed) and is a material inherent value.

Herein, a basic element (spin accumulation element) structure in which a non-magnetic metallic fine line is used as the non-magnetic substance and two magnetic substances are laminated on the non-magnetic fine line, will be described below. Of the two magnetic substances, the first magnetic substance is used as a spin injection source by passing a current from the first magnetic substance to the non-magnetic substance. The other or second magnetic substance is a detection part for the output voltage with spin accumulation effect. Since the ferromagnetic substance generally has a different spin density (the number of up spin electrons and the number of down spin electrons are different) at the Fermi level, a difference in the spin density is induced in the non-magnetic fine line by passing a current from the first magnetic substance to the non-magnetic substance. It is well known that due to the accumulated spin polarized electrons, the non-magnetic substance behaves like ferromagnetic substance in the range of spin diffusion length (see non-patent document 1 and "Spin Injection and Detection in Magnetic Nanostructures", Physics Review B, vol. 67, (2003), p. 52409 "non-patent document 2"). Using this effect, a voltage difference $\Delta V$ is produced depending on the magnetization directions of the first magnetic substance and the second magnetic substance. This voltage difference is called an output voltage $\Delta V$ of the spin accumulation element. As a method for measuring the output voltage, a non-local voltage measurement in which no current flows through the voltage detection part is generally employed (see non-patent document 1). To increase $\Delta V$, it is effective that the spin diffusion length $\lambda$ is made longer, or the electrode distance d1 between two electrodes is decreased as disclosed in Japanese Patent Publication No. 2004-186274 ("patent document 2").

The reproducing head using the basic element has a feature that a fixed layer and a free layer can be fully separated, and the gap length between shields can be narrowed down. However, the conventional spin accumulation element does not have enough output, and is required to have the higher output. One of the methods for increasing the output voltage of the reproducing head using the spin accumulation effect is to narrow down the magnetic substance interval d1 between two magnetic substances making up the spin accumulation element. However, with the present micro fabrication technique, the magnetic substance interval is about 30 nm at minimum, and impossible to narrow down to infinitesimal. Also, if the magnetic substance interval distance is smaller, a magnetic interaction acts between two magnetic substances, possibly degrading the magnetic characteristics. Therefore, there is a demand for a new method for reducing the attenuation of spin electrons without narrowing down the magnetic substance interval.

BRIEF SUMMARY OF THE INVENTION

Embodiments of the present invention provide an accumulation element with high resolving power and high output suitable for magnetic recording and reproducing at high recording density. As shown in the embodiment of FIG. 1, a plurality of spin injection parts 10 and 11 are provided to increase the total amount of spin electrons. The spin accumulation element is composed of a non-magnetic conductor 1, a first magnetic conductor 3, a second magnetic conductor 8, and a third magnetic conductor 6, each of which are in contact with the non-magnetic conductor through the tunneling junction. An output voltage due to the spin accumulation effect is detected as a potential difference between the non-magnetic conductor 1 and the third magnetic conductor 6. The first magnetic conductor 3 of the first spin injection part 10 is fixed by a first antiferromagnetic conductor 4 and the second magnetic conductor 8 of the second spin injection part 11 is fixed by a second antiferromagnetic conductor 4 so that their directions of magnetization are anti-parallel to each other.

DETAILED DESCRIPTION OF THE INVENTION

Embodiments of the present invention relate to a magnetic head having a magneto-resistive effect element and a magnetic recording apparatus using the magnetic head.

The spin accumulation element of embodiments of the invention has a plurality of spin injection parts. Though the spin injection was conventionally performed using the single spin injection part, a plurality of spin injection parts are provided to increase the total amount of spin electrons in the invention.

In embodiments of the invention, as a first spin injection part, a first magnetic conductor, of which the magnetization is fixed in one direction, is formed on a non-magnetic conductor. Also, a second spin injection part is formed on the opposite side of the first spin injection part in the perpendicular direction of the ingredient film, with the non-magnetic conductor sandwiched, or formed on the same side of the first spin injection part and spaced from the first spin injection part on the non-magnetic conductor. The second spin injection part has a second magnetic conductor, of which the direction of magnetization is anti-parallel to that of the first magnetic conductor of the first spin injection part. Also, as a detection part of the output voltage, a third magnetic conductor is formed on the non-magnetic conductor in the range of spin diffusion length from the spin injection part. When a sense current is passed from the first spin injection part to the non-magnetic conductor and to the second spin injection part, spin-polarized electrons are injected from the first and second spin injection parts into the non-magnetic conductor. Thereby, the spin electron density in the non-magnetic conductor is increased, and the output voltage due to the spin accumulation effect is increased.

Also, the second spin injection part may have the non-magnetic conductor, and when a current is passed through the second spin injection part, spin polarized electrons produced due to a reversible spin Hall effect may be injected.

With embodiments of the invention, the amount of spin electrons accumulated in the non-magnetic substance can be increased over the conventional spin accumulation element. As one example, the output signal due to the spin accumulation effect is increased 100% or more over the spin accumulation element using the single spin injection part. This is caused by the effect of the plurality of spin injection parts and the mirror reflection of spin electrons in the non-magnetic conductor. As a result, it is possible to provide the magnetic reproducing head with high resolving power and high output.

Embodiments of the present invention will be described below in detail.

Figure 1:
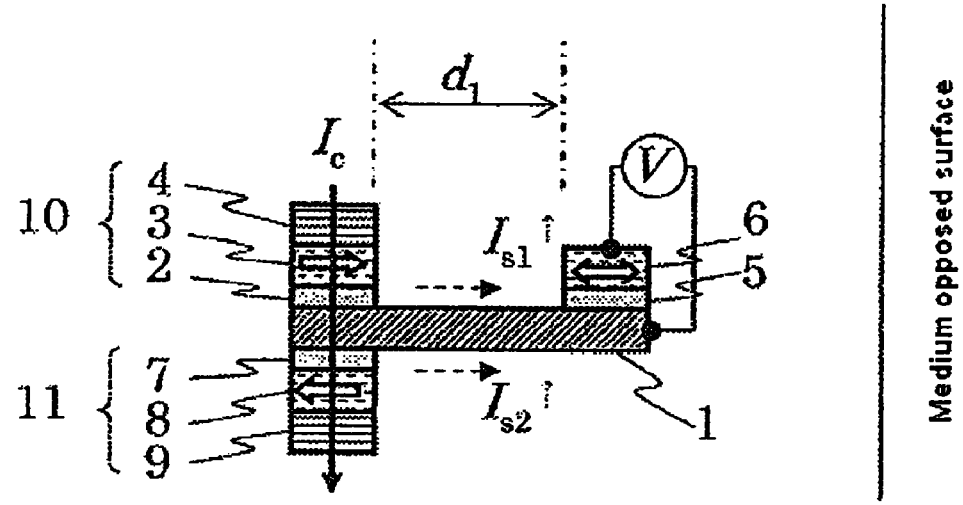
FIG. 1 is a cross-sectional view of a first spin accumulation element.

FIG. 1 shows a first spin accumulation element to which an embodiment of the invention is applied. In the first spin accumulation element, a non-magnetic conductor 1 and a first magnetic conductor 3 laminated on the non-magnetic conductor 1 are in contact with each other through a first tunneling junction 2 formed on the non-magnetic conductor 1. Herein, the non-magnetic conductor 1 is a non-magnetic fine line, although its shape is not limited. The first magnetic conductor 3 has the magnetization direction magnetically fixed by a first antiferromagnetic substance 4. This magnetic conductor 3 is a first spin injection part 10. The method for fixing the magnetization of the magnetic conductor is not limited thereto, but a laminated ferrimagnetic structure may be used to magnetically fix the magnetization. Also, a third magnetic conductor 6 is in contact via a third tunneling junction 5 with the non-magnetic conductor 1. The magnetization of the third magnetic conductor 6 freely rotates under the influence of an external magnetic field. On the other hand, a second magnetic conductor 8 is joined via a second tunneling junction 7 with the non-magnetic conductor 1, in which the magnetization direction is magnetically fixed in one direction by a second antiferromagnetic substance 9. The second magnetic conductor 8 is joined on the opposite side of the first magnetic conductor 3 in a film thickness direction of the non-magnetic conductor 1, and constitutes a second spin injection part 11. Herein, the first spin accumulation element has a feature that the magnetization directions of the first magnetic conductor 3 and the second magnetic conductor 8 are antiparallel to each other.

The non-magnetic conductor 1 may be made of a non-magnetic conductive metal such as Cu, Ag, Al, Yb, Ru, Ir or Rh, or a conductive compound containing GaAs, Si, TiN, TiO or $ReO_3$ as the main component. The distance d1 between the first magnetic conductor 3 and the third magnetic conductor 6 is desirably shorter ($d_1 < \lambda$) than a spin diffusion length $\lambda$ inherent to each substance to produce a full output as a magnetic reproducing head, although the effect is observable under the condition of $d_1 > \lambda$. A barrier layer 2 may be a monolayer or laminated film made of the material containing at least one kind of MgO, $Al_2O_3$, AlN, $SiO_2$, $HfO_2$, $Zr_2O_3$, $Cr_2O_3$, $TiO_2$ and $SrTiO_3$. The magnetic conductor 3 may be made of the material of Co, Ni, Fe or Mn, or alloy or compound containing at least one kind of these elements as the main component. Further, embodiments of the present invention also cover the magnetic layer containing an oxide having a structure of $AB_2O_4$ (where A is at least one of Fe, Co and Zn, and B is one of Fe, Co, Ni, Mn and Zn) represented by half metal $Fe_3O_4$, a compound in which one or more components of transition metals Fe, Co, Ni, Cr and Mn are added to $CrO_2$, CrAs, CrSb or ZnO, a compound in which Mn is added to GaN, or a whistler alloy of the type $C_2D \times E1 \times F$ (where C is at least one kind of Co, Cu and Ni, D and E are one kind of Mn, Fe and Cr, and F is at least one component of Al, Sb, Ge, Si, Ga and Sn) represented by $CO_2MnGe$, $CO_2MnSb$ and $CO_2Cr_{0.6}Fe_{0.4}Al$. The antiferromagnetic conductor 4 may be made of MnIr, MnPt or MnRh.

In the first spin accumulation element, when a current $I_c$ is passed from the first spin injection part 10 to the non-magnetic conductor 1, up polarized spin electrons (spin electrons $I_{s1}\uparrow$) are injected from the first spin injection part into the non-magnetic conductor 1. The injected spin electrons $I_{s1}\uparrow$, of which the polarization direction is reverse to the magnetization direction of the second magnetic conductor 8, are reflected from the interface with the second spin injection part 11, and efficiently injected into the non-magnetic conductor 1. On the other hand, due to a current passing from the non-magnetic conductor 1 to the second magnetic conductor

8, down spin electrons $I_{s2}^{\downarrow}$ in the non-magnetic conductor 1 are transmitted into the second spin injection part 11, so that $I_{s2}^{\uparrow}$ are accumulated in the non-magnetic conductor 1. In other words, $I_{s2}^{\uparrow}$ are injected, independently of $I_{s1}^{\uparrow}$, into the non-magnetic conductor 1 by the second spin injection part 11. The injected spin electrons $I_{s2}^{\uparrow}$ are also reflected from the interface with the first spin injection part 10, as previously described. Thus, spin electrons synthesized of $I_{s1}^{\uparrow}$ and $I_{s2}^{\uparrow}$ are accumulated in the non-magnetic conductor 1, and an output voltage dependent on the magnetization direction of the third magnetic conductor 6 occurs between the third magnetic conductor 6 and the non-magnetic conductor 1.

Figure 2:
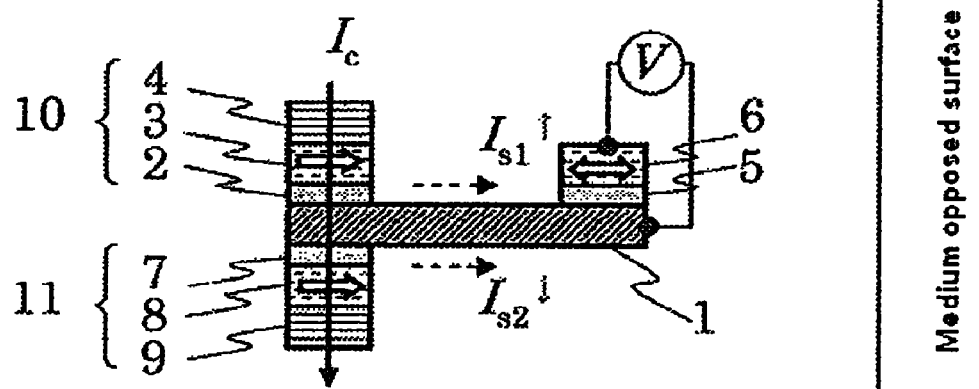
FIG. 2 is a cross-sectional view of a second spin accumulation element.

FIG. 2 is a constitutional view of a second spin accumulation element which is shown for comparison with the first spin accumulation element. An element structure is the same as in FIG. 1, but is different from the first spin accumulation element in that the magnetization directions of the first magnetic conductor 3 and the second magnetic conductor 8 are parallel to each other. A current $I_c$ is passed from the first spin injection part 10 to the non-magnetic conductor 1 and the second spin injection part 11. Like the element of FIG. 1, up polarized spin electrons $I_{s1}^{\uparrow}$ are injected from the first spin injection part 10 to the non-magnetic conductor 1. At this time, since the up spin electrons $I_{s1}^{\uparrow}$ injected into the non-magnetic conductor 1 are parallel to the magnetization direction of the second magnetic conductor 8, they are easily transmitted into the second magnetic conductor 8. On the other hand, down polarized spin electrons $I_{s1}^{\downarrow}$ antiparallel to the magnetization direction of the second magnetic conductor 8 are accumulated on the interface between the second spin injection part 11 and the non-magnetic conductor 1. Therefore, spin electrons $I_{s1}^{\uparrow}$ and spin electrons $I_{s2}^{\downarrow}$ cancel each other, so that spin electrons polarized in one direction are less likely to accumulate in the non-magnetic conductor 1. That is, the effects of embodiments of the invention can not be fully attained with the second spin accumulation element as shown in FIG. 2. Thereby, it is required that the magnetization directions of the first magnetic conductor 1 and the second magnetic conductor 8 are antiparallel to each other to obtain the effects of embodiments of the invention.

Figure 3:
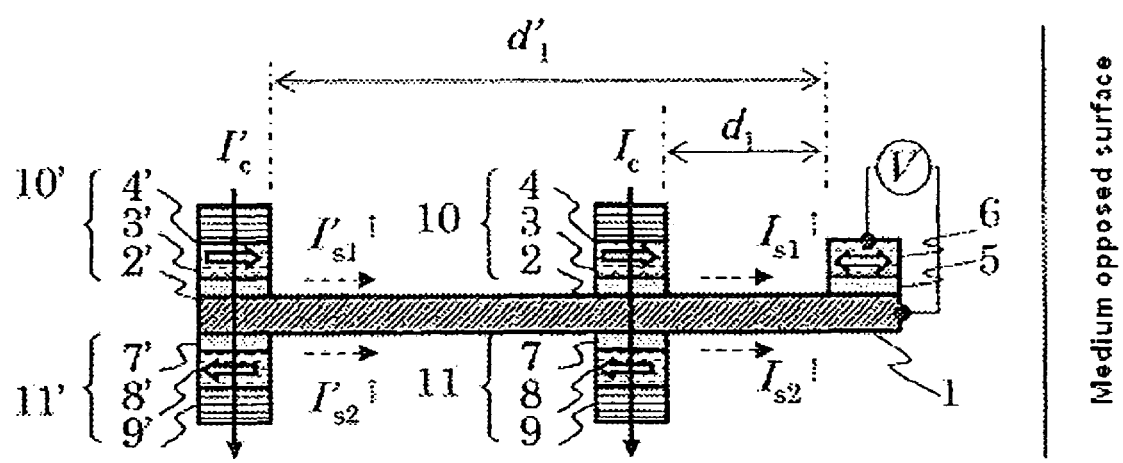
FIG. 3 is a cross-sectional view of a third spin accumulation element.

FIG. 3 shows a constitutional example of a third spin accumulation element according to embodiments of the invention. This spin accumulation element has a structure comprising, in addition to the first and second spin injection parts 10 and 11 making up the first spin accumulation element, the third and fourth spin injection parts 10' and 11' that are added on the same line and on the opposite side of the third magnetic conductor 6 with the first and second injection parts sandwiched. The structure and material of the third and fourth spin injection parts 10' and 11' newly added are the same as the first and second spin injection parts as shown in FIG. 1. It is assumed that the distance between the third spin injection part 10' and the third magnetic conductor 6 is $d_1'$. Also, a current $I_c'$ is applied from the third spin injection part 10' to the fourth spin injection part 11'. With this structure, spin electrons $I_{s1}$, $I_{s2}$, $I'_{s1}$, and $I'_{s2}$ are accumulated in the non-magnetic conductor 1, as described with reference to FIG. 1, so that the total output voltage is further greater than the structure of FIG. 1. Though the first and second spin injection parts 10 and 11 of FIG. 1 are increased by each one in the example as shown in FIG. 3, two or more spin injection parts may be increased.

Figure 4:
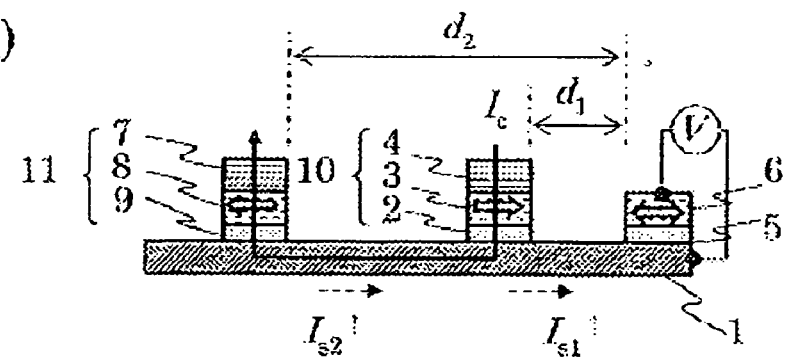
FIGS. 4(a)-4(c) are cross-sectional views of a fourth spin accumulation element.
Figure 4:
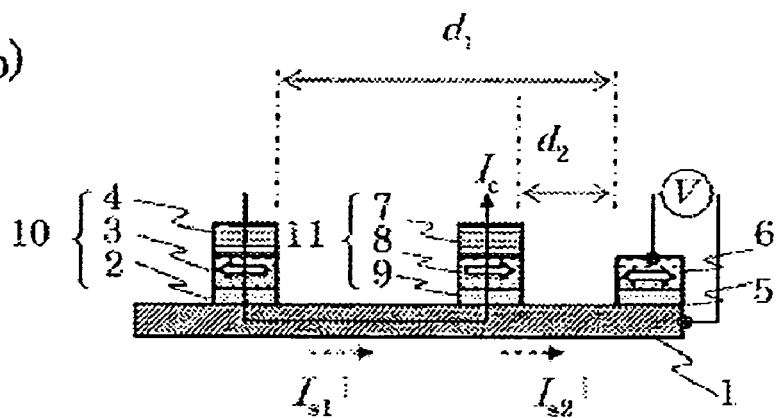
Figure 4:
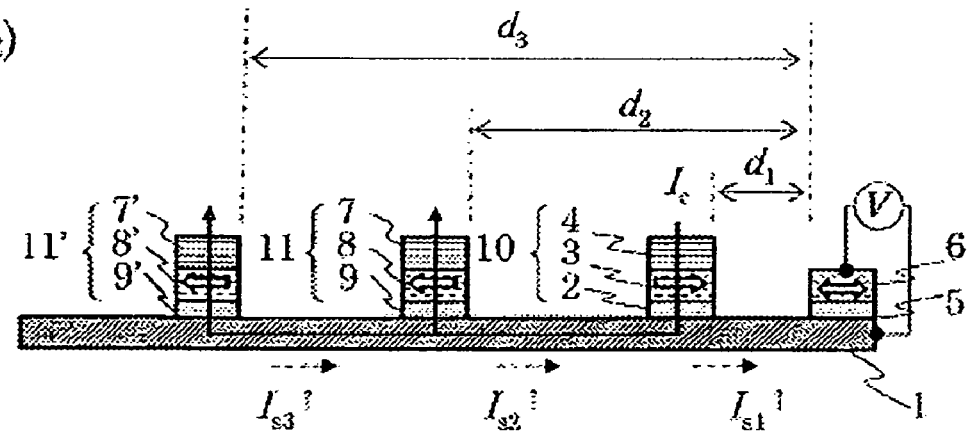

FIG. 4(a) shows a fourth spin accumulation element of an embodiment of the invention. The fourth spin accumulation element, unlike the first spin accumulation element, has a feature that the second spin injection part is formed on the same plane as the first spin injection part. The magnetization directions of the first magnetic conductor 3 and the second magnetic conductor 8 are antiparallel to each other. A current $I_c$ is applied from the first spin injection part 10 to the second spin injection part 11. In the first spin injection part 10, up polarized spin electrons $I_{s1}^{\uparrow}$ are injected into the non-magnetic conductor 1, and accumulated in the non-magnetic conductor 1 in the range of spin diffusion length. On the other hand, in the second spin injection part 11, up polarized spin electrons $I_{s2}^{\uparrow}$ are likewise accumulated in the non-magnetic conductor 1 in the range of spin diffusion length. Since the output voltage is defined by the sum of $I_{s1}^{\uparrow}$ and $I_{s2}^{\uparrow}$, the output voltage of this fourth spin accumulation element is larger than the spin accumulation element having the single spin injection part.

FIG. 4(b) shows a structure in which the second spin injection part 11 is arranged between the first spin injection part 10 and the third magnetic conductor 6. With this structure, since it is required that the second spin injection part 11 is formed between the first spin injection part 10 and the third magnetic conductor 6, it is difficult to narrow down the magnetic substance distance $d_1$. As a result, the output voltage is decreased. Therefore, in the case where the second spin injection part is arranged on the same line as the first spin injection part, the structure of FIG. 4(a) is more preferable. Also, FIG. 4(c) shows a structure in which a third spin injection part 11' is newly added. With this structure, since spin electrons $I_{s3}^{\uparrow}$ are newly accumulated in the non-magnetic conductor 1, the output is increased due to the effect of accumulated spin electrons $I_{s3}^{\uparrow}$, in addition to the effect as described with reference to FIG. 4(a). In this manner, the invention may comprise a plurality of second spin injection parts 11 of FIG. 3.

Figure 5:
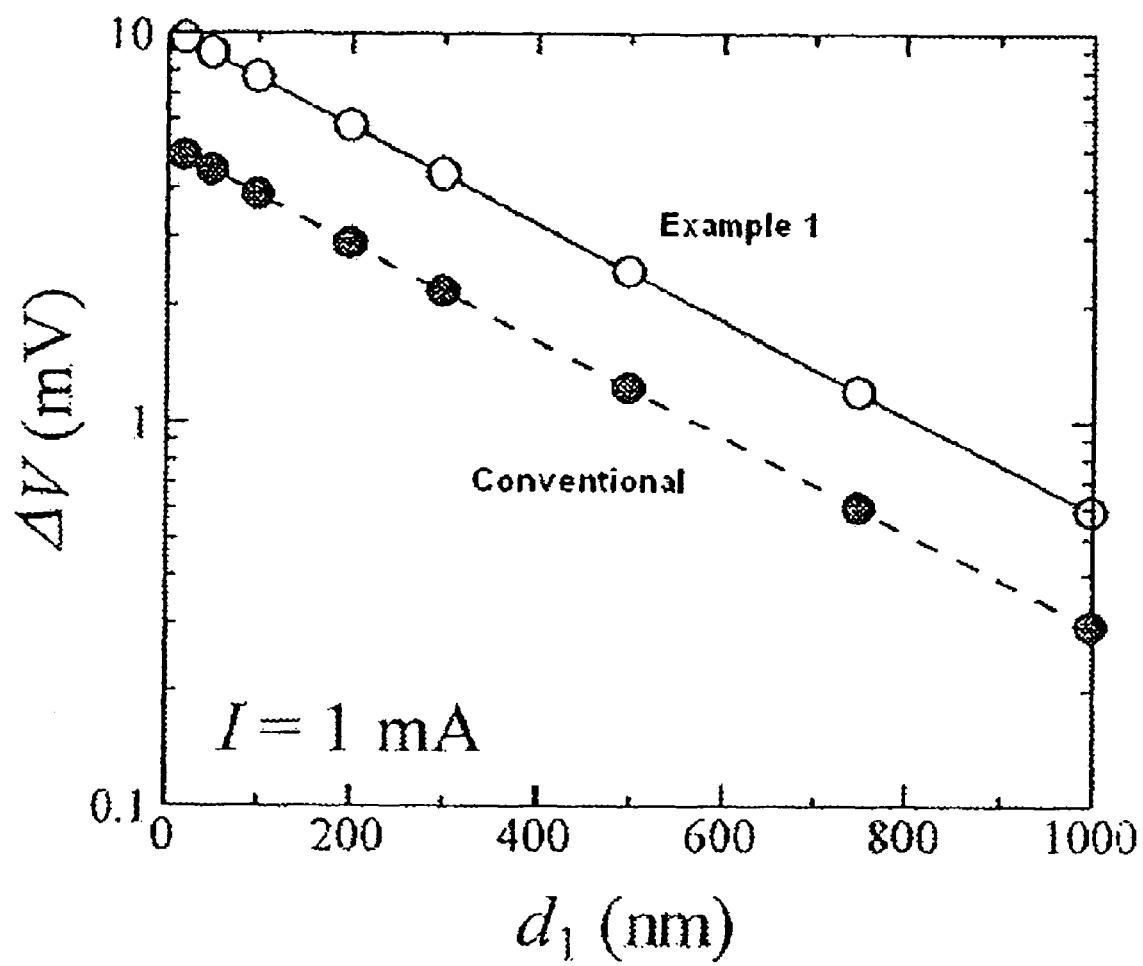
FIG. 5 is a view showing the magnetic electrode distance dependency of the output voltage in the first spin accumulation element.

FIG. 5 shows the magnetic electrode distance dependency of an output signal of the first spin accumulation element according to an embodiment of the invention. The solid line represents the output voltage of the first spin accumulation element according to an embodiment of the invention, and the broken line represents the output voltage of the element having the single spin injection part. In the first spin accumulation element, it is assumed that the line width of the non-magnetic conductor 1 is $w_N$, the film thickness is $t_N$, the spin polarizability on the interface between the first spin injection part 10 and the non-magnetic conductor 1 is $P_{i1}$, the spin polarizability on the interface between the third magnetic conductor 6 and the non-magnetic conductor 1 is $P_d$, the spin diffusion length of the non-magnetic conductor 1 is $\lambda_N$, the resistivity of the non-magnetic conductor 1 is $\rho_N$, and the distance between the first magnetic conductor 3 and the third magnetic conductor 6 is $d_1$. According to a theory of spin accumulation phenomenon, the output voltage of a basic element having the single spin injection part can be represented in the following expression (non-patent document 2).

[Numerical Expression 1]

$$\Delta V = P_i P_d [\lambda_N / w_N t_N] \rho_N \exp[-\lambda_N / d_m] \times I_c \qquad (1)$$

In the example 1, since two spin injection sources are arranged in the distance d1 from the third magnetic conductor 6, the output voltage of the element having the plurality of spin injection parts is specified by the total sum of spin electrons, as previously described, and can be represented as $$\Delta V = (P_{i1} + P_{i2}) P(\lambda_N / w_N t_N) \rho_N P_{i1} P_d \exp(-\lambda_N / d_1) \times I_c \qquad (2)$$

where the spin polarizability on the interface between the second spin injection part 11 and the non-magnetic conductor 1 is $P_{i2}$. Further, the output voltage with n spin injection parts can be represented in the following expression.

[Numerical Expression 2]

$$\Delta V = \sum_{m=1}^{n} P_{im} P_{dm} [\lambda_N / w_N t_N] \rho_N \exp[-\lambda_N / d_m] \times I_{cm} \quad (3)$$

where the distance between the nth spin injection part and the third magnetic conductor 6 is $d_n$ and the current value passing through the spin injection part is $I_{cn}$. Thereby, in the case where the plurality of spin injection parts are provided, the output voltage is larger than the conventional spin accumulation element having the single spin injection.

Figure 6:
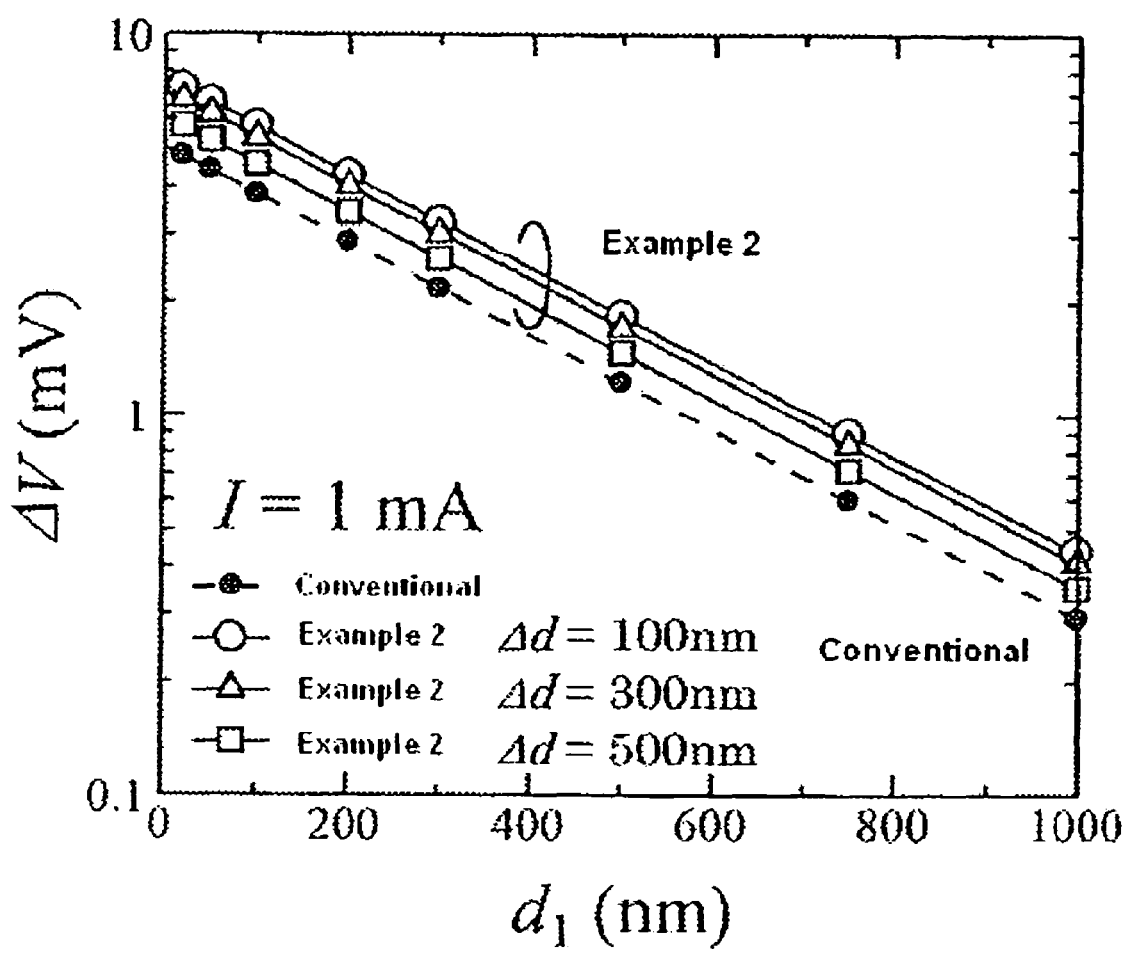
FIG. 6 is a view showing the magnetic electrode distance dependency of the output voltage in the fourth spin accumulation element.

FIG. 6 shows the magnetic electrode distance $d_1$ dependency of the output signal of the fourth spin accumulation element according to an embodiment of the invention as shown in FIG. 4(a). The solid line represents the output voltage of the fourth spin accumulation element according to an embodiment of the invention, and the broken line represents the output voltage of the spin accumulation element having the single spin injection part. In the fourth spin accumulation element, it is assumed that the line width of the non-magnetic conductor 1 is $w_N$, the film thickness is $t_N$, the spin polarizability on the interface between the first spin injection part 10 and the non-magnetic conductor 1 is $P_{i1}$, the spin polarizability on the interface between the second spin injection part 11 and the non-magnetic conductor 1 is $P_{i2}$, the spin polarizability on the interface between the third magnetic conductor 6 and the non-magnetic conductor 1 is $P_d$, the spin diffusion length of the non-magnetic conductor 1 is $\lambda_N$, the resistivity of the non-magnetic conductor 1 is $\rho_N$, the distance between the first magnetic conductor 3 and the third magnetic conductor 6 is $d_1$, and the distance between the second magnetic conductor 8 and the third magnetic conductor 8 is $d_2$. Since the total output voltage is written in the expression (3), the output voltage in the example 2 is:

$$\Delta V = P_d(\lambda_N/w_N t_N)\rho_N [P_{i1}\exp(-\lambda_N/d_1) + P_{i2}\exp(-\lambda_N/d_2)] \times I_c \quad (4)$$

Therefore, in the example 2, when d1 and d2 are narrowed down, the effects of embodiments of the invention can be sufficiently obtained.

Figure 7:
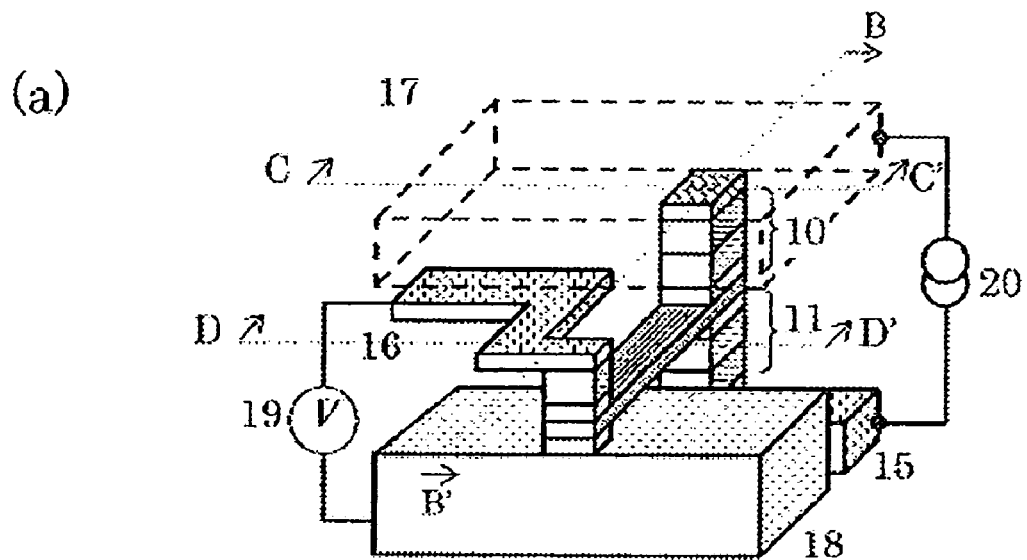
FIGS. 7(a)-7(c) are schematic views of a reproducing head using the first spin accumulation element.
Figure 7:
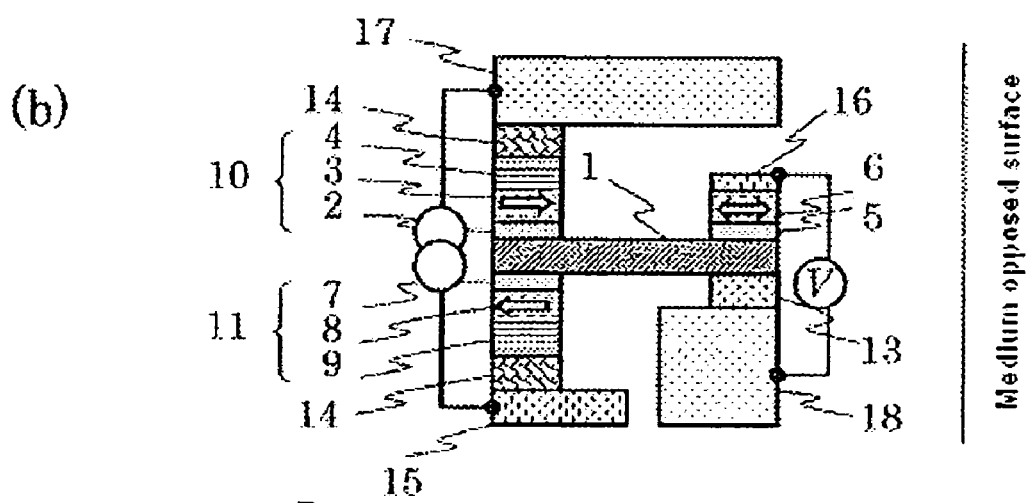
Figure 7:
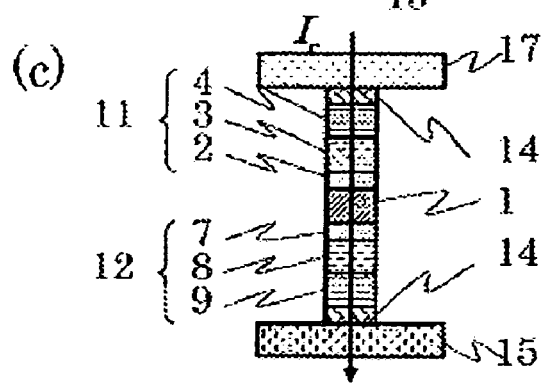
Figure 7:
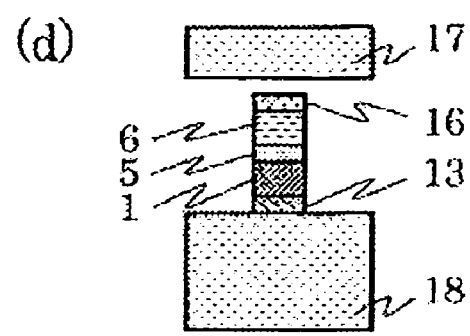

FIGS. 7(a)-7(d) show a reproducing head having the first spin accumulation element of an embodiment of the invention. FIG. 7(a) is a perspective view of the reproducing head, and FIGS. 7(b), 7(c) and 7(d) show the cross sections taken along BB', CC' and DD'. The spin injection part of the reproducing head as shown in FIG. 7(c) has a structure in which a current terminal 15, a buffer layer 14, the second spin injection part 11, the non-magnetic conductor 1, the first spin injection part 10, a buffer layer 14, and a top shield 17 are laminated successively. The buffer layer 14 is required to form the antiferromagnetic substance, and typically made of Cu, Pt or Ru. A current $I_c$ is conducted to the current terminal 15 from the top shield 17 at any time. A detection part of leakage flux, which is shown in FIG. 7(d), has a structure in which a bottom shield 18, a contact 13, the non-magnetic conductor 1, a third tunneling junction 5, the third magnetic conductor 6, a voltage terminal 16, and the top shield 17 are laminated successively. The contact 13 is used to detect a potential of the non-magnetic conductor 1 on the bottom shield 18. The voltage terminal 16 is electrically insulated from the top shield 17, and has a structure for detecting the output voltage between the voltage terminal 16 and the bottom shield 18.

Subsequently, a spin accumulation element using the non-magnetic conductor in the second spin injection part will be described below. A spin injection method using the non-magnetic conductor involves the use of a reversible spin Hall effect. The reversible spin Hall effect is a phenomenon in which spin electrons are polarized in the Hall direction of current to induce a flow of spin electrons (spin flow) when a current is passed through the non-magnetic conductor having great spin-orbit interaction as disclosed in "Room-Temperature Reversible Spin Hall Effect", Physics Review Letters, T. Kimura, Y. Otani, T. Sato, S. Takahashi, and S. Maekawa, vol. 98, (2007), pp. 156601 ("non-patent document 3").

Figure 8:
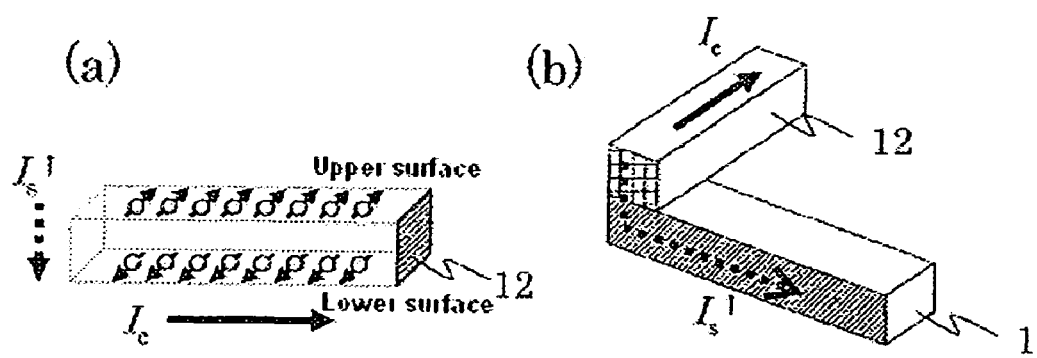
FIGS. 8(a) and 8(b) are explanatory views of the reversible spin Hall effect.

FIG. 8(a) is a typical view where a current $I_c$ is applied to a non-magnetic fine line 12 (e.g., Pt or Au) having great spin-orbit interaction. When the current $I_c$ is passed in the direction of fine line, up spin electrons and down spin electrons in the non-magnetic conductor are polarized to the end face of the non-magnetic fine line 12 owing to a strong spin-orbit interaction. Therefore, in the non-magnetic fine line 12, a difference in chemical potential is produced in the Hall direction where the current $I_c$ flows, causing a phenomenon in which spin electrons flow. FIG. 8(b) shows a structure in which the non-magnetic conductor 12 having great spin-orbit interaction is laminated on the non-magnetic conductor 1 made of different material. In this case, if a current is applied in the fine line direction of the non-magnetic fine line 12, spin electrons $I_s^\uparrow$ are injected into the non-magnetic conductor 1 from the interface between the non-magnetic fine line 12 and the non-magnetic conductor 1 owing to the reversible spin Hall effect. The injected spin electrons $I_s^\uparrow$ are accumulated in the non-magnetic conductor 1. Using this effect, the new spin injection part can function. If the current is reversed, the polarity of injected spin electrons is reversed, whereby it is required that the orientation of spins injected from the first spin injection part and the direction of current passed through the non-magnetic fine line 12 are uniquely determined.

Figure 9:
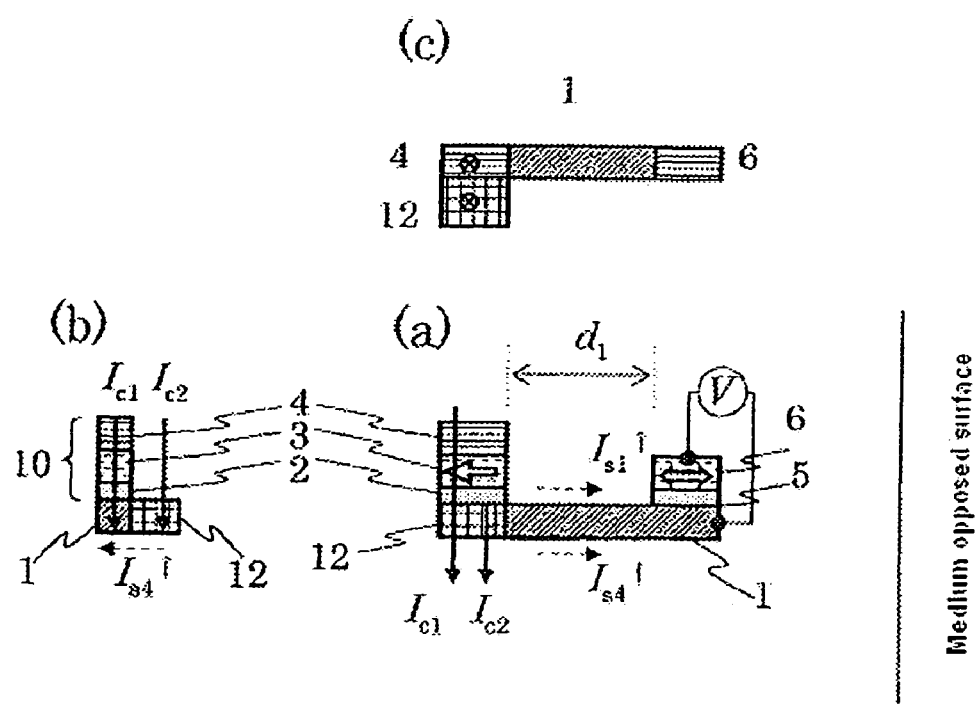
FIGS. 9(a), 9(b) and 9(c) are a cross-sectional view, a side view as seen from the spin injection part, and a plan view as seen from the top of the fifth spin accumulation element, respectively.

FIGS. 9(a)-9(c) show a fifth spin accumulation element using the reversible spin Hall effect according to an embodiment of the invention. The fifth spin accumulation element has a structure in which the tunneling junction 2, the first magnetic conductor 3, and the antiferromagnetic conductor 4 are laminated successively on the non-magnetic conductor 1 as the first spin injection part 10. Also, a detection part of output voltage can detect a potential difference between the non-magnetic conductor 1 and the magnetic conductor 6 owing to a structure having the tunneling junction 5 and the magnetic conductor 6 on the non-magnetic conductor 1. The fifth spin accumulation element has a feature that the non-magnetic conductor 12 having great spin-orbit interaction is provided in the second spin injection part. The material of the second spin injection part 12 may be non-magnetic conductor having great spin-orbit interaction which is d or f metal atom or intermetallic compound such as Pt, Au, Pd or $Sr_2RuO_4$.

FIGS. 9(a), 9(b) and 9(c) are a cross-sectional view, a side view as seen from the spin injection part, and a plan view as seen from the top of the fifth spin accumulation element, respectively. The first spin injection part 10 is laminated in a film thickness direction of the non-magnetic conductor 1 and the second spin injection part 12 is electrically joined with the non-magnetic conductor 1 in a line width direction. Also, the magnetic conductor 6 for voltage detection is joined with the non-magnetic conductor 1 via the tunneling junction 5. This element has a structure in which the first spin injection part 10 and the second spin injection part 12 have a common current terminal, and currents $I_{c1}$, and $I_{c2}$ flow independently through the first and second spin injection parts. As previously described, in the first spin injection part 10, up polarized spin electrons $I_{s1}^\uparrow$ are injected into the non-magnetic conductor 1. On the other hand, since the current $I_{c2}$ flows from top to bottom on the interface between the second spin injection part 12 and the non-magnetic conductor 1, as shown in FIG. 9(b), up polarized spin electrons $I_{s4}^{\uparrow}$ are induced, so that spin electrons $I_{s4}^{\uparrow}$ are accumulated in the non-magnetic conductor 1 by continuously passing the current $I_{c2}$. Therefore, a total of up polarized spin electrons $I_{s1}^{\uparrow}$ and $I_{s4}^{\uparrow}$ is accumulated, so that the output signal increases by a contributory amount of $I_{s4}^{\uparrow}$. With the structure in which currents $I_{c1}$ and $I_{c2}$ flow from top to bottom, the effects of the invention can be sufficiently obtained when the magnetization direction of the first magnetic conductor 3 is fixed to the left, as shown in FIG. 9(a). Further, by using the common current terminal for the currents $I_{c1}$ and $I_{c2}$, the number of electrodes is unchanged from the conventional spin accumulation reproducing head even when the reversible spin Hall effect is used.

Figure 10:
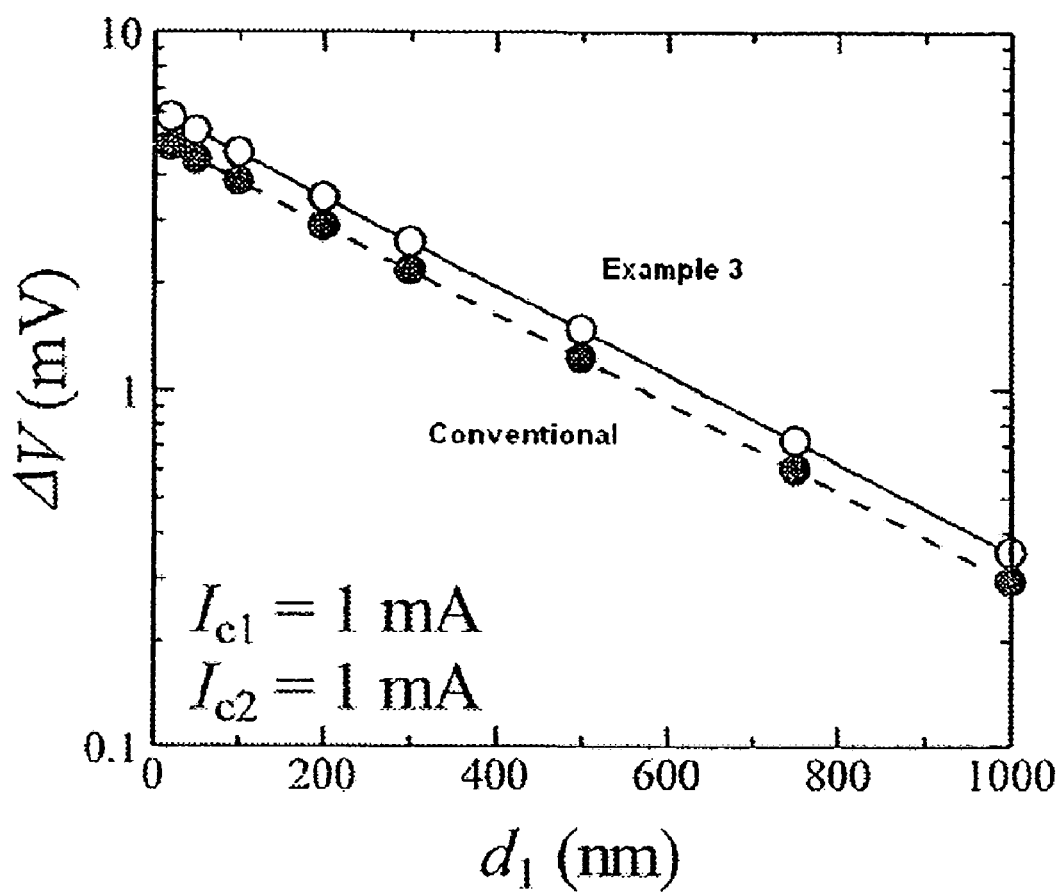
FIG. 10 is a view showing the magnetic electrode distance dependency of the output voltage in the fifth spin accumulation element.

FIG. 10 shows the magnetic electrode distance dependency of the output signal of the fifth spin accumulation element according to the invention. The solid line represents the output voltage of the fifth spin accumulation element according to an embodiment of the invention, and the broken line represents the output voltage of the spin accumulation element having the single spin injection part. In the fifth spin accumulation element, assuming that the line width of the non-magnetic conductor 1 is $w_N$, the film thickness is $t_N$, the line width of the second spin injection part in a direction perpendicular to the fine line direction of the non-magnetic conductor 1 is $w_{SH}$, the spin polarizability on the interface between the first spin injection part 10 and the non-magnetic conductor 1 is $P_i$, the spin polarizability of the detection part on the interface between the magnetic conductor 6 and the non-magnetic conductor 1 is $P_d$, the spin diffusion length of the non-magnetic conductor 1 is $\lambda_N$, the resistivity of the non-magnetic conductor 1 is $\rho_N$, the resistivity of the second spin injection part is $\rho_{SH}$, the spin Hall coefficient of the second spin injection part is $\alpha_{SH}$, and the distance between the first magnetic conductor 3 and the magnetic conductor 6 is $d_1$, the output voltage owing to the spin accumulation effect in the reversible spin Hall effect can be represented in the form of:

$$\Delta V_{SH} = \alpha_{SH}(P_d/w_{SH})\rho_{SH}\exp(-d_1/\lambda_N) \times I_{c2} \quad (5)$$

(non-patent document 3), whereby, it is expected that as the line width of the non-magnetic conductor making up the second spin injection part is decreased, the output is increased.

Figure 11:
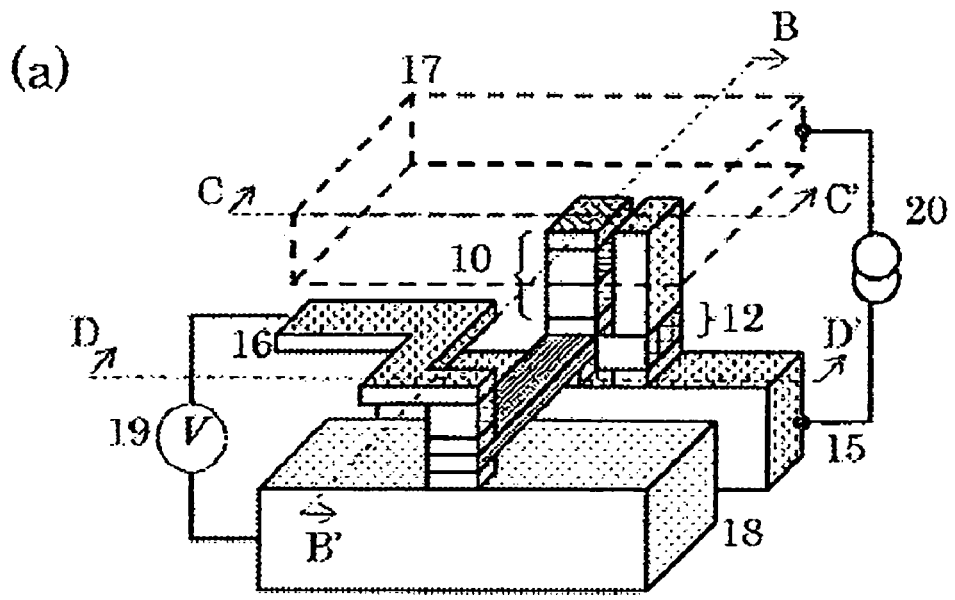
FIGS. 11(a)-11(d) are schematic views of the reproducing head using the fifth spin accumulation element.
Figure 11:
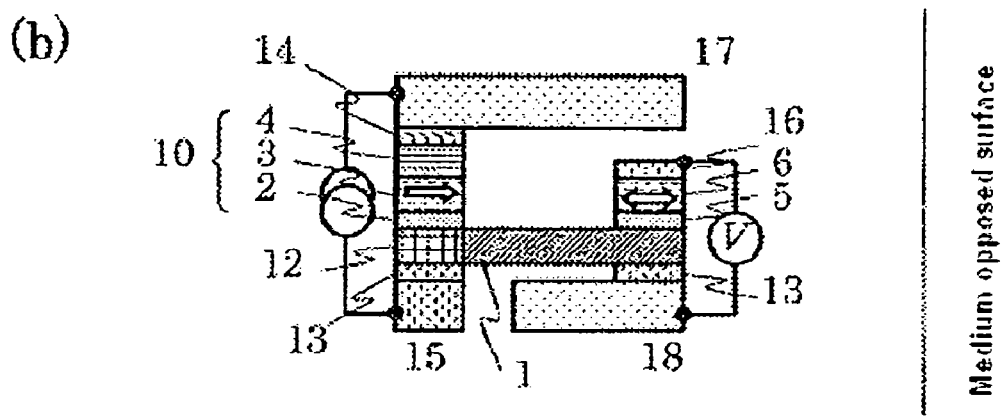
Figure 11:
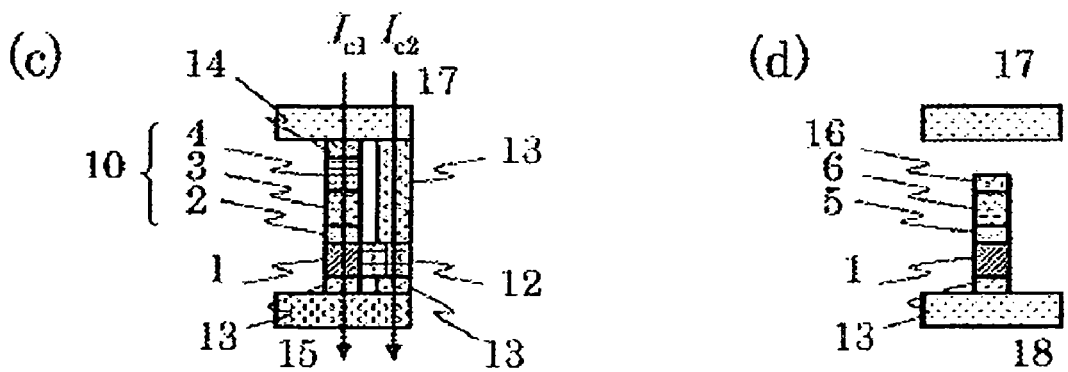

FIGS. 11(a)-11(d) are typical views of the reproducing head having the fifth spin accumulation element. FIG. 11(a) is a perspective view of the reproducing head, and FIGS. 11(b), 11(c) and 11(d) show the cross sections taken along BB', CC' and DD'.

The spin injection part of the reproducing head has a structure in which the current terminal 15, the contact 13, the non-magnetic conductor 1, the first spin injection part 10, the buffer layer 14, and the top shield 17 are laminated successively, and the second spin injection part 12 is electrically joined with the non-magnetic conductor 1, as shown in FIG. 11(c). It is assumed that the currents flowing through the first spin injection part 10 and the second spin injection part are $I_{c1}$ and $I_{c2}$, and the current terminal is common to the top electrode 18 and the electrode terminal 15. The non-magnetic conductor making up the second spin injection part 12 is connected with the electrode terminal 15 and the top shield 17 via the contact 13. A detection part of leakage flux, which is shown in FIG. 11(d), has a structure in which the bottom shield 18, the contact 13, the non-magnetic conductor 1, the tunneling junction 5, the magnetic conductor 6, the voltage terminal 16, and the top shield 17 are laminated successively. The voltage terminal 16 is electrically insulated from the top shield 17, and detects the output voltage between the voltage terminal 16 and the bottom shield 18.

Figure 12:
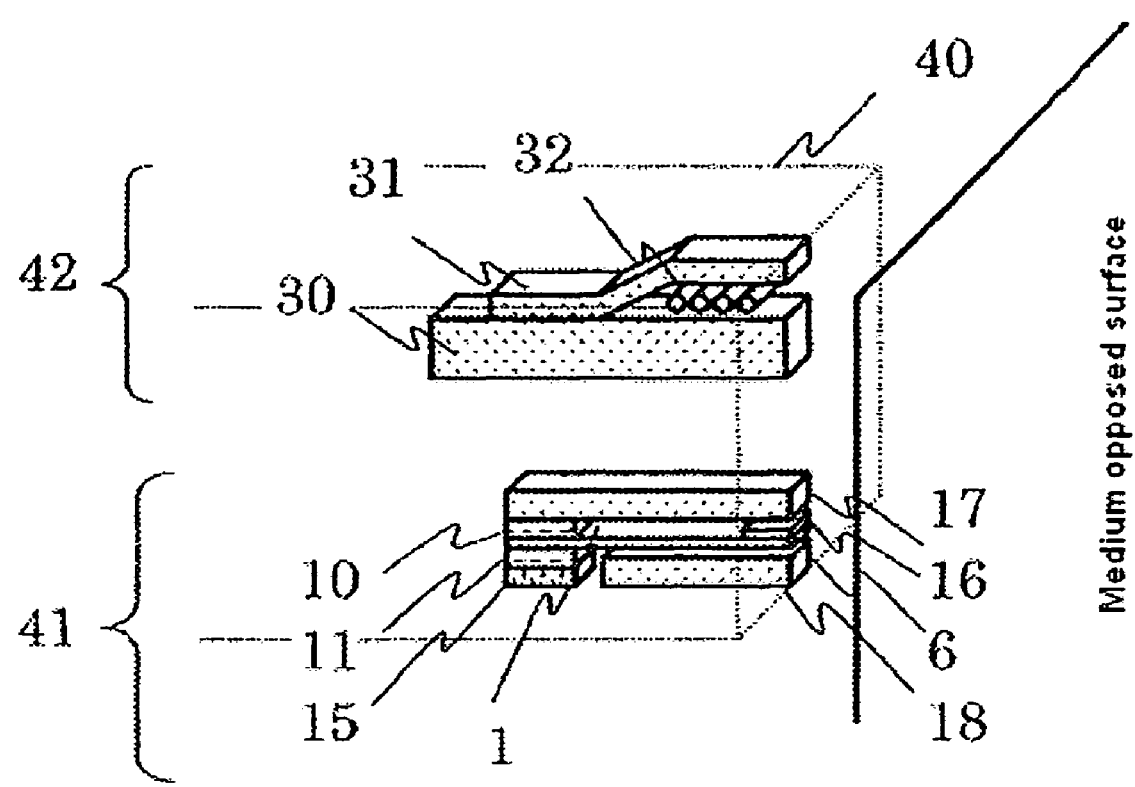
FIG. 12 is a schematic view of a magnetic head having the reproducing head and recording head according to an embodiment of the invention.

FIG. 12 is a typical view of a magnetic head 40 that is combined with a laminated recording head 42 and uses as a reproducing head 41 the spin accumulation element having a plurality of spin injection parts according to the invention. Though the spin accumulation element as shown is the first spin accumulation element of an embodiment of the invention, the spin accumulation element of an embodiment the invention having the other structure may be employed.

Figure 13:
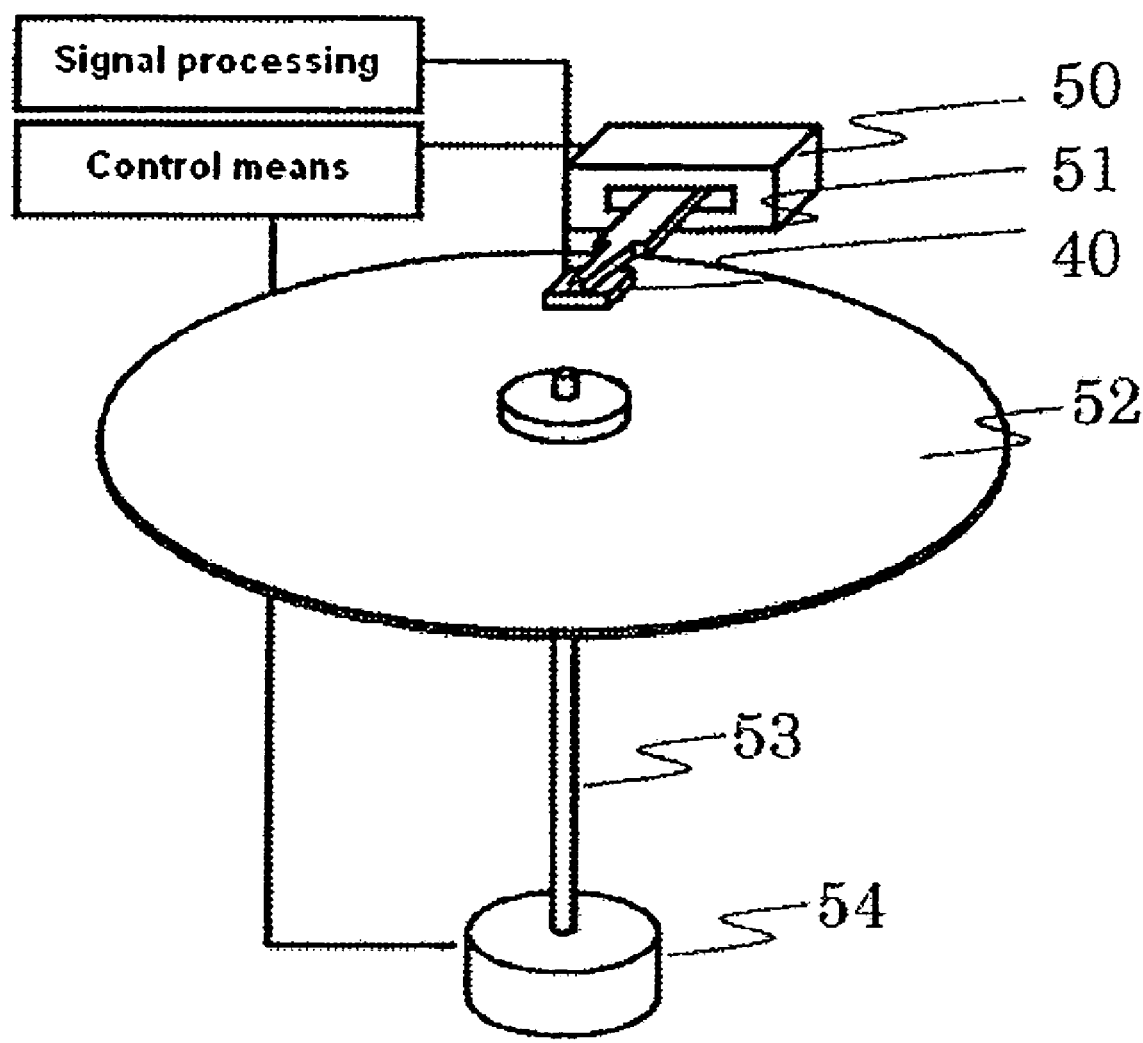
FIG. 13 is a schematic view of a magnetic recording apparatus having the magnetic head according to an embodiment of the invention.

FIG. 13 is a typical view of a magnetic recording apparatus according to an embodiment of the invention. This magnetic recording apparatus comprises a magnetic recording medium 52 having a magnetic recording layer, a drive section 54 for driving the magnetic recording medium, the magnetic head 40 according to an embodiment of the invention for performing the recording and reproducing operation on and from the magnetic recording medium, an actuator 50 and a slider 51 for moving the magnetic head to a predetermined position on the magnetic recording medium, and means for processing the output signal from the magnetic head. The magnetic recording medium such as a longitudinal recording continuous medium, a perpendicular recording continuous medium, a discrete medium or a pattern medium may be employed.

EXAMPLE 1

To verify the effect of the first spin injection element of the invention as shown in FIGS. 1 and 7(a)-7(d), two kinds of spin accumulation element were fabricated. For the first spin accumulation element, the material of the non-magnetic conductor 1 was Al. The Al fine line as used in the example 1 had a line width $w_N$ of 100 nm, a film thickness $t_N$ of 10 nm, and a length $L_N$ of 3 µm, with the electrical resistivity $\rho_N$ being 2.5 µΩcm. An Al—$O_x$ barrier layer was employed as the first tunneling junction 2, the second tunneling junction 7 and the third tunneling junction 5. The Al—$O_x$ barrier was formed by naturally oxidizing the surface of the Al fine line. Co having a film thickness of 10 nm was employed as the first magnetic conductor 3, the second magnetic conductor 8 and the third magnetic conductor 6. The line width $w_{co1}$, $w_{co2}$ of the first magnetic conductor $C_{o1}$ and the second magnetic conductor $C_{o2}$ was 200 nm, and the line width $w_{co3}$ of the third magnetic conductor $C_{o3}$ was 100 nm. The element was fabricated in which the magnetization of $C_{o1}$ and $C_{o2}$ was fixed in one direction by an antiferromagnetic conductor MnIr having a film thickness of 10 nm, with the magnetization directions antiparallel to each other, and the distance $d_1$ between $C_{o1}$ and $C_{o3}$ was changed in the range 30 nm $\leq d_1 \leq$ 1000 nm. In this element, the polarizability $P_{i1}$, $P_{i2}$, $P_d$ on the interface between $C_{o1}$, $C_{o2}$, $C_{o3}$ and Al was 0.4, and the spin diffusion length $\lambda_N$ of Al was 350 nm. For comparison, the conventional spin accumulation element having the single spin injection part was fabricated. The conventional spin accumulation element has a structure without having the second spin injection part 11 for the first spin accumulation element.

A non-local voltage measurement was conducted by passing a current $I_c$=1 mA through the first spin accumulation element of the invention and the conventional spin accumulation element, and applying a magnetic field in parallel to the fine line direction of the non-magnetic conductor 1 to the third magnetic conductor 6, whereby a potential difference dependent on the relative direction of magnetization between $C_{o1}$ and $C_{o3}$ was obtained. This potential difference $\Delta V$ is called an output voltage, and the $d_1$ dependency of the output voltage $\Delta V$ is shown in FIG. 5. The white circle denotes the measured value of the element according to the invention, and the black circle denotes the measured value of the conventional structure element. Both the conventional spin accumulation element and the first spin accumulation element of the invention had the measurement results that the ΔV decreased exponentially as $d_1$ increased. This reflects that spin electrons in the non-magnetic conductor are accumulated in the exponential manner.

The conventional spin accumulation element having the single spin injection part showed a quantitatively excellent coincidence with the theoretical expression, as indicated by the broken line. On the other hand, the output voltage ΔV of the first spin accumulation element of an embodiment of the invention observed a 100% or more increase over the conventional one. This is the effect that the total of spin electrons in the non-magnetic conductor increased because the plurality of spin injection parts were provided. Also, since the magnetization directions of the first magnetic conductor and the second magnetic conductor are antiparallel, as previously described, it is considered that the mirror reflection effect of spin electrons in the non-magnetic conductor also contributes.

EXAMPLE 2

In the example 2, the fourth spin accumulation element of an embodiment of the invention was fabricated as shown in FIG. 4(a). The material and size of the element were the same as in the example 1, except that the second spin injection part 12 was provided on the non-magnetic conductor 1 on the same side of the first spin injection part 11 with a spacing from it, as shown in FIG. 4(a). Assuming that the interval distance between the first spin injection part 10 and the second spin injection part 11 was Δd ($=d_2-d_1$), three kinds of Δd=100, 300 and 500 nm were prepared, whereby the non-local measurement was conducted in the range of 30 nm≦d1≦1000 nm. A magnetic field was applied in parallel to the fine line direction of the non-magnetic conductor 1.

FIG. 6 shows the electrode distance $d_1$ dependency of the output voltage ΔV in the case of Δd=100, 300 and 500 nm in the fourth spin accumulation element of an embodiment of the invention. For comparison, the result of the conventional spin accumulation element having the single spin injection part is also shown. The measurement results were obtained in which the output voltage ΔV of the fourth spin accumulation element according to the invention decreased in the exponential form with respect to $d_1$ as in the example 1. Also, the magnitude of the output voltage was increased about 80% over the conventional one in the case of Δd=100 nm. This increase is caused by a contribution of spin electrons in the second spin injection part and the mirror reflection effect of spin electrons in the non-magnetic conductor. Also, as the interval distance Δd between the first spin injection part 10 and the second spin injection part 11 increased, the increase ratio of the output signal ΔV decreased. For example, at Δd=500 nm, an increase of about 20% was observed over the conventional element, whereby the effects of the invention are not too remarkable.

EXAMPLE 3

In the example 3, the fifth spin injection element of the invention was fabricated as shown in FIGS. 9(a)-9(c) and FIGS. 11(a)-11(d). The non-magnetic conductor 1 as employed in the example 3 was the Al fine line having the size of the line width $w_N$=100 nm, the film thickness $t_N$=10 nm, and the length $L_N$=3 μm, with the electrical resistivity $\rho_N$ being 2.5 μΩcm. An Al—$O_x$ barrier layer that was produced by naturally oxidizing the surface of Al was employed as the tunneling junctions 2 and 5 as shown in FIGS. 9(a)-9(c). Co having a film thickness of 10 nm was employed as the first magnetic conductor 3 and the third magnetic conductor 6. The line width of the first magnetic conductor $C_{o1}$ was $w_{co1}$=200 nm and the line width of the third magnetic conductor $C_{o3}$ was $w_{co3}$=100 nm. The magnetization of $C_{o1}$ was fixed in one direction by the antiferromagnetic conductor MnIr having a film thickness of 10 nm, and the distance between $C_{o1}$ and $C_{o3}$ was narrowed down to $d_1$=30 nm at minimum. On the other hand, as the second spin injection part 12, Pt that is the non-magnetic conductor having great spin-orbit interaction was used. The size of Pt was the line width $w_{SH}$=30 nm, the length $L_{SH}$=200 nm and the film thickness $t_{SH}$=10 nm, and Pt was metallically joined on the side face of the Al fine line. In this element, the polarizability on the interface between $C_{o1}$, $C_{o3}$ and Al was $P_t$, $P_d$=0.4, the spin diffusion length of Al was $\lambda_N$=350 nm, the spin diffusion length of $P_t$ was $\lambda_N$=100 nm, the electrical resistivity of Pt was $\rho_{SH}$=10 μΩcm, and the spin Hall coefficient was $\alpha_{SH}$=0.37. Thus, in the fifth spin accumulation element, the output voltage ΔV was measured by the non-local measurement. The current $I_{c1}$ flowing through the first spin injection part and the current $I_{c1}$ flowing through the fourth spin injection part were directed from the top electrode to the bottom electrode, so that the magnitude of both currents might be 1 mA. A magnetic field was applied in parallel to the fine line direction of the non-magnetic conductor 1.

FIG. 10 shows the electrode distance d1 dependency of the output voltage ΔV in the fifth spin accumulation element according to the invention. For comparison, the result of the conventional spin accumulation element having the single spin injection part is also shown. The output voltage ΔV of the fifth spin accumulation element of the invention decreased in the exponential manner as $d_1$ increased, but an increase of about 20% was observed over the conventional spin accumulation element. This increase amount is the effect of spin injection owing to the reversible spin Hall effect, and the effect of this example can be also explained using the expression (5). Though the line width of Pt in the second spin injection part 12 was 30 nm in this measurement result as shown herein, the greater output can be expected by narrowing down the line width of $P_t$. If the spin Hall coefficient $\alpha_{SH}$ is increased by changing the material of the second spin injection part, the output signal is also increased.

As described above, because the plurality of spin injection parts were provided, the increased output signal was confirmed as compared with the spin accumulation element having the single spin injection part. By applying the spin accumulation element of embodiments of the invention, the reproducing head having higher resolving power and higher output can be obtained.

What is claimed is:
1. A magnetic head, comprising:
a first non-magnetic conductor having a first side and a second side opposite the first side;
a first tunneling junction disposed on the first side of the first non-magnetic conductor;
a first magnetic conductor laminated on said first tunneling junction;
a first antiferromagnetic conductor disposed on the first magnetic conductor;
a second tunneling junction disposed on the second side of the first non-magnetic conductor;
a second magnetic conductor laminated on said second tunneling junction;

a second antiferromagnetic conductor disposed on the second magnetic conductor; and a terminal for detecting a voltage between said first magnetic conductor and said first non-magnetic conductor.

2. The magnetic head according to claim 1, further comprising:

a third tunneling junction disposed on the first side of the first non-magnetic conductor; and a third magnetic conductor disposed on the third tunneling junction, wherein the magnetization of said second magnetic conductor and the magnetization of said third magnetic conductor are anti-parallel to each other.

3. The magnetic head according to claim 2, wherein an interval between said first magnetic conductor and said third magnetic conductor is shorter than a spin diffusion length of said first magnetic conductor.

4. The magnetic head according to claim 2, further comprising:

a first buffer layer disposed on the first antiferromagnetic conductor;

a first shield disposed on the first buffer layer;

a second buffer layer disposed on the second antiferromagnetic conductor; and a second shield disposed on the second buffer layer, wherein the magnetization of said second magnetic conductor is fixed by the second antiferromagnetic conductor and wherein the magnetization of said third magnetic conductor is fixed by a third antiferromagnetic conductor.

5. The magnetic head according to claim 1, further comprising a second non-magnetic conductor in contact with said first non-magnetic conductor and means for applying the current to said second non-magnetic conductor.

6. The magnetic head according to claim 5, wherein magnetization of said second magnetic conductor is fixed in a direction where spin electrons polarized in one direction are injected by the second antiferromagnetic conductor, a current in a direction where spin electrons with the same polarity as the polarization direction of spin electrons injected by said second magnetic conductor are injected is passed through said second non-magnetic conductor, and said second non-magnetic conductor is in contact with said first non-magnetic conductor in a vertical direction to the direction of applied current.

7. The magnetic head according to claim 5, further comprising a first shield and a second shield, wherein said second magnetic conductor and said second non-magnetic conductor have a common current terminal.

8. A magnetic recording apparatus having:

a magnetic recording medium;

a drive section for driving said magnetic recording medium;

a magnetic head for making a recording/reproducing operation for said magnetic recording medium;

an actuator for moving said magnetic head to a predetermined position on said magnetic recording medium; and a processor configured to process an output signal from said magnetic head;

wherein said magnetic head comprises:

a first non-magnetic conductor having a first side and a second side opposite the first side;

a first tunneling junction disposed on the first side of the first non-magnetic conductor;

a first magnetic conductor laminated on said first tunneling junction;

a first antiferromagnetic conductor disposed on the first magnetic conductor;

a second tunneling junction disposed on the second side of the first non-magnetic conductor;

a second magnetic conductor laminated on said second tunneling junction;

a second antiferromagnetic conductor disposed on the second magnetic conductor; and a terminal for detecting a voltage between said first magnetic conductor and said first non-magnetic conductor.

9. The magnetic recording apparatus according to claim 8, further comprising:

a third tunneling junction disposed on the first side of the first non-magnetic conductor; and a third magnetic conductor disposed on the third tunneling junction, wherein the magnetization of said second magnetic conductor and the magnetization of said third magnetic conductor are anti-parallel to each other.

10. The magnetic recording apparatus according to claim 9, wherein an interval between said first magnetic conductor and said third magnetic conductor is shorter than a spin diffusion length of said first magnetic conductor.

11. The magnetic recording apparatus according to claim 9, further comprising:

a first buffer layer disposed on the first antiferromagnetic conductor;

a first shield disposed on the first buffer layer;

a second buffer layer disposed on the second antiferromagnetic conductor; and a second shield disposed on the second buffer layer, wherein the magnetization of said first magnetic conductor is fixed by the first antiferromagnetic conductor and wherein the magnetization of said third magnetic conductor is fixed by a third antiferromagnetic conductor.

12. The magnetic recording apparatus according to claim 8, further comprising a second non-magnetic conductor in contact with said first non-magnetic conductor and means for applying the current to said second non-magnetic conductor.

13. The magnetic recording apparatus according to claim 12, wherein magnetization of said second magnetic conductor is fixed in a direction where spin electrons polarized in one direction are injected by the second antiferromagnetic conductor, a current in a direction where spin electrons with the same polarity as the polarization direction of spin electrons injected by said second magnetic conductor are injected is passed through said second non-magnetic conductor, and said second non-magnetic conductor is in contact with said first non-magnetic conductor in a vertical direction to the direction of applied current.

14. The magnetic recording apparatus according to claim 12, further comprising a first shield and a second shield, wherein said second magnetic conductor and said second non-magnetic conductor have a common current terminal.

15. The magnetic head of claim 1, wherein the first non-magnetic conductor is selected from the group consisting of Cu, Ag, Al, Yb, Ru, Ir, Rh, GaAs, Si, TiN, TiO and ReO$_3$.

16. The magnetic head of claim 1, wherein the first tunneling junction is selected from the group consisting of MgO, Al$_2$O$_3$, AlN, SiO$_2$, HfO$_2$, Zr$_2$O$_3$, Cr$_2$O$_3$, TiO$_2$ and SrTiO$_3$.

17. The magnetic head of claim 1, wherein the first antiferromagnetic conductor is selected from the group consisting of MnIr, MnPt and MnRh.

18. The magnetic recording apparatus of claim 8, wherein the first non-magnetic conductor is selected from the group consisting of Cu, Ag, Al, Yb, Ru, Ir, Rh, GaAs, Si, TiN, TiO and ReO$_3$.

19. The magnetic recording apparatus of claim 8, wherein the first tunneling junction is selected from the group consisting of MgO, Al$_2$O$_3$, AlN, SiO$_2$, HfO$_2$, Zr$_2$O$_3$, Cr$_2$O$_3$, TiO$_2$ and SrTiO$_3$.

20. The magnetic recording apparatus of claim 8, wherein the first antiferromagnetic conductor is selected from the group consisting of MnIr, MnPt and MnRh.

* * * * *